United States Patent
Kim et al.

(10) Patent No.: US 9,070,713 B2
(45) Date of Patent: Jun. 30, 2015

(54) POWER SEMICONDUCTOR DEVICE AND METHODS FOR FABRICATING THE SAME

(71) Applicant: FAIRCHILD KOREA SEMICONDUCTOR LTD., Bucheon (KR)

(72) Inventors: Jin-myung Kim, Goyang (KR); Se-woong Oh, Anyang (KR); Jae-gil Lee, Incheon (KR); Young-chul Choi, Seoul (KR); Ho-cheol Jang, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 14/165,187

(22) Filed: Jan. 27, 2014

(65) Prior Publication Data

US 2014/0141584 A1 May 22, 2014

Related U.S. Application Data

(62) Division of application No. 13/443,371, filed on Apr. 10, 2012, now Pat. No. 8,674,402.

(30) Foreign Application Priority Data

Apr. 15, 2011 (KR) .................. 10-2011-0035212

(51) Int. Cl.
| | |
|---|---|
| H01L 29/66 | (2006.01) |
| H01L 29/10 | (2006.01) |
| H01L 29/739 | (2006.01) |
| H01L 29/78 | (2006.01) |
| H01L 29/06 | (2006.01) |
| H01L 29/08 | (2006.01) |
| H01L 29/423 | (2006.01) |

(52) U.S. Cl.
CPC ....... *H01L 29/66712* (2013.01); *H01L 29/0696* (2013.01); *H01L 29/0878* (2013.01); *H01L 29/1095* (2013.01); *H01L 29/4238* (2013.01); *H01L 29/7395* (2013.01); *H01L 29/7802* (2013.01)

(58) Field of Classification Search
CPC .............. H01L 29/66712; H01L 29/0696; H01L 29/0878; H01L 29/1095; H01L 29/7395; H01L 29/7802
See application file for complete search history.

(56) References Cited

U.S. PATENT DOCUMENTS

| | | | |
|---|---|---|---|
| 6,344,676 B1 | 2/2002 | Yun et al. | |
| 7,586,148 B2 | 9/2009 | Blanchard | |
| 2001/0046739 A1* | 11/2001 | Miyasaka et al. | 438/268 |

FOREIGN PATENT DOCUMENTS

| | | |
|---|---|---|
| JP | 2009-016601 | 1/2009 |
| KR | 1020000061628 | 10/2000 |

* cited by examiner

*Primary Examiner* — Long Pham
(74) *Attorney, Agent, or Firm* — Okamoto & Benedicto LLP

(57) ABSTRACT

A power semiconductor device includes: a drain region of a first conductive type; a drift region of a first conductive type formed on the drain region; a first body region of a second conductive type formed below an upper surface of the drift region; a second body region of a second conductive type formed below the upper surface of the drift region and in the first body region; a third body region of a second conductive type formed by protruding downwards from a lower end of the first body region; a source region of a first conductive type formed below the upper surface of the drift region and in the first body region; and a gate insulating layer formed on channel regions of the first body region and on the drift region between the first body regions.

3 Claims, 15 Drawing Sheets

POWER SEMICONDUCTOR DEVICE AND METHODS FOR FABRICATING THE SAME

CROSS-REFERENCE TO RELATED APPLICATIONS

This application is a divisional of U.S. application Ser. No. 13/443,371, filed on Apr. 10, 2012, which claims the benefit of Korean Patent Application No. 10-2011-0035212, filed on Apr. 15, 2011, in the Korean Intellectual Property Office. The just mentioned disclosures are incorporated herein by reference in their entirety.

BACKGROUND

The inventive concept relates to a power semiconductor device, and more particularly, to a power semiconductor device having a low on-resistance and a high breakdown voltage and a method of fabricating the semiconductor device.

Power semiconductor devices, for example, metal-oxide semiconductor field-effect transistors (MOSFETs) or insulation gate bi-polar transistors (IGBTs) for power devices must satisfy characteristics such as a high breakdown voltage and a low on-resistance.

SUMMARY

The inventive concept provides a power semiconductor device having a high breakdown voltage and a low on-resistance.

The inventive concept also provides a method of fabricating a power semiconductor device having a high breakdown voltage and a low on-resistance.

According to an aspect of the inventive concept, there is provided a power semiconductor device including: a drain region of a first conductive type; a drift region of a first conductive type formed on the drain region; a first body region of a second conductive type formed below an upper surface of the drift region; a second body region of a second conductive type formed below the upper surface of the drift region and in the first body region, and formed to have a depth shallower than that of the first body region; a third body region of a second conductive type formed by protruding downwards from a lower end of the first body region; a source region of a first conductive type formed below the upper surface of the drift region and in the first body region, and formed to have a depth shallower than that of the second body region; a gate insulating layer formed on channel regions of the first body region and on the drift region between the first body regions; a gate electrode formed on the gate insulating layer; a source electrode electrically connected to the source region; and a drain electrode electrically connected to the drain region.

The first body region may have a doping concentration of the second conductive type lower than that of the second body region, and the third body region may have a doping concentration of the second conductive type lower than that of the second body region.

The power semiconductor device may be a metal-oxide semiconductor field-effect transistor (MOSFET). The first conductive type may be an n-type and the second conductive type may be a p-type or the first conductive type may be a p-type and the second conductive type may be an n-type.

The first body region may include at least one stripe type region and may further include frame regions connected to both end sides of the first body regions. The gate insulating layer may be formed in a stripe type in the same direction as the first body regions. Edge regions of the first body regions may have a radius of curvature greater than 100 µm.

The first body regions may include polygonal shape unit cells.

The drain region may have a doping concentration of the first conductive type higher than that of the drift region, and the source region may have a doping concentration of the first conductive type higher than that of the drift region.

A width of the drift region that overlaps the gate electrode between the first body regions may have a size by which a depletion region formed by extending from the first body region forms a planar junction structure.

The power semiconductor device may further include an additional drift region of a first conductive type formed below the upper surface of the drift region, surrounding the first body region and the third body region, wherein the additional drift region has a doping concentration of the first conductive type higher than that of the drift region.

The third body region may be disposed between the gate electrodes adjacent to each other. The third body region may have a depth deeper than that of the first body region.

The source region may be formed on a position where it overlaps with a portion of the gate electrode and a portion of the source electrode. The first body region may be formed on a position where it overlaps with a portion of the gate electrode and the source electrode.

According to another aspect of the inventive concept, there is provided a power semiconductor device. The power semiconductor device includes: a collector region of a second conductive type; a drift region of a first conductive type formed on the collector region; a first base region of a second conductive type formed below an upper surface of the drift region; a second base region of a second conductive type formed below the upper surface of the drift region and in the first base region and formed shallower than the depth of the first base region; a third base region of a second conductive type formed by protruding downwards from a lower end of the first base region; an emitter region of a first conductive type formed below the upper surface of the drift region and in the first base region, and formed to have a depth shallower than that of the second base region; a gate insulating layer formed on channel regions of the first base regions and on the drift region between the first base regions; a gate electrodes formed on the gate insulating layer; an emitter electrode electrically connected to the emitter region; and a collector electrode electrically connected to the collector region.

The first base region may have a doping concentration of the second conductive type lower than that of the second base region, and the third base region may have a doping concentration of the second conductive type lower than that of the second base region.

The power semiconductor device may be an insulation gate bipolar transistor (IGBT).

According to an aspect of the inventive concept, there is provided a method of fabricating a power semiconductor device.

The method includes: forming a drain region of a first conductive type; forming a drift region of a first conductive type on the drain region; forming a first body region of a second conductive type below an upper surface of the drift region; forming a second body region of a second conductive type having a depth shallower than that of the first body region below the upper surface of the drift region and in the first body region; forming a third body region of a second conductive type protruded downwards from a lower end of the first body region; forming a source region of a first conductive type having a depth shallower than that of the second body region below the upper surface of the drift region and in the first body region; forming a gate insulating layer on channel regions of the first body regions and on the drift region between the first body regions; forming a gate electrode on the gate insulating layer; forming a source electrode electrically connected to the source region; and forming a drain electrode electrically connected to the drain region.

The first body region may have a doping concentration of the second conductive type lower than that of the second body region, and the third body region may have a doping concentration of the second conductive type lower than that of the first body region.

The forming of the first body region may be performed after performing the forming of the third body region and the forming of the second body region may be performed after performing the forming of the first body region.

In the power semiconductor device and the method of fabricating the power semiconductor device according to the inventive concept, a breakdown voltage is increased and an on-resistance is reduced by reducing an edge electric field while minimizing the increase in a JFET resistance.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
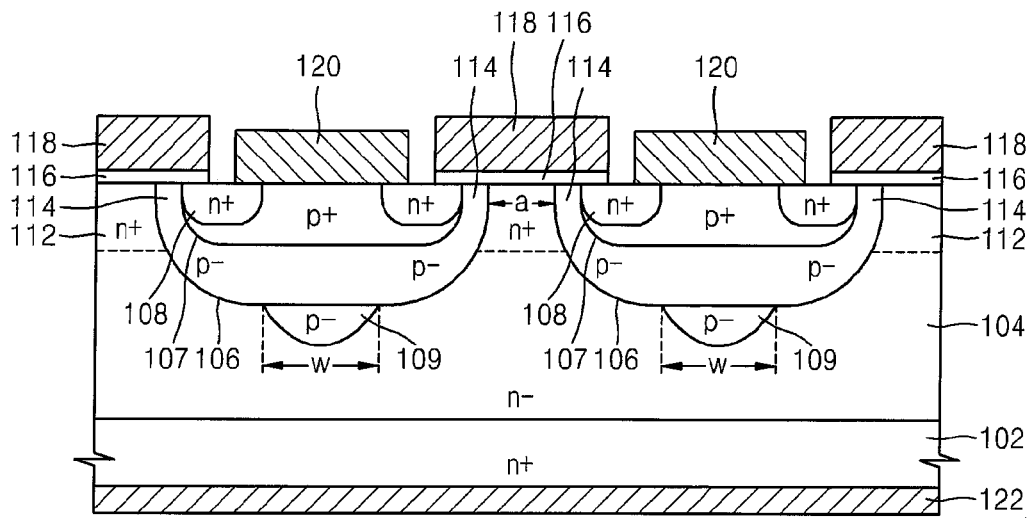
FIG. 1 is a cross-sectional view of a power semiconductor device, for example, a metal-oxide semiconductor field-effect transistor (MOSFET), according to an embodiment of the inventive concept.

The inventive concept will be described more fully with reference to the accompanying drawings, in which exemplary embodiments of the present invention are shown.

This invention may, however, be embodied in many different forms and should not construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer may be directly on another element or layer or intervening elements or layers. In contrast, when an element is referred to as being "directly on" another element or layer, there are no intervening elements of layers present. Like reference numerals in the drawings denote like elements throughout. As used herein, the term "and/or" includes any and all combinations of one or more of the associated listed items.

It will be understood that, although the terms first, second, third, etc., may be used herein to describe various elements, these elements should not be limited by these terms. These terms are only used to distinguish one element from another. Thus, a first element could be termed a second element and a second element could be termed a first element without departing from the teachings of the present inventive concept.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptions used interpreted accordingly.

The terminology used herein is for the purpose of describing particular embodiments only and is not intended to be limiting of the invention. The singular forms include the plural forms unless the context clearly indicates otherwise. It will further understood that the terms "comprise" and/or "comprising" when used in this specification, specify the presence of stated features, integers, steps, operations, elements, and/or components, but do not preclude the presence or addition of one or more other features, integers, steps, operations, elements, components, and/or groups thereof.

A first conductive type may be an n-type and a second conductive type may be a p-type, and hereinafter, for convenience of explanation, these terms are used. However, the technical sprit of the inventive concept is not limited thereto, for example, the first conductive type may be a p-type and the second conductive type may be an n-type.

First, the variation of a breakdown voltage according to a junction structure in a metal-oxide semiconductor field-effect transistor (MOSFET) will be described. An ideal breakdown voltage $BV_{pp}$ of a junction having an infinite planar structure is determined by Equation 1 below.

$$BVpp = 5.34 \times 10^{13} \times Na^{-\frac{3}{4}} \quad \text{[Equation 1]}$$

where, $N_a$ is a doping concentration of a drift layer.

Accordingly, it may be seen that an ideal breakdown voltage $BV_{pp}$ of a junction having a planar structure depletion region is only determined by a doping concentration.

Also, a punch-through type breakdown voltage $BV_{pt}$ may be determined by Equation 2 below.

$$BVpt = 4010 \times Na^{\frac{1}{8}} \times Wp - 0.05 \times \frac{qNaWp^2}{\varepsilon_s} \quad \text{[Equation 2]}$$

where, $W_p$ is a thickness of a drift layer, and $\varepsilon_s$ is a dielectric constant.

Accordingly, because the breakdown voltage $BV_{pt}$ is determined according to the concentration and thickness of a drift layer, the punch-through type breakdown voltage $BV_{pt}$ may vary according to the type of a junction structure.

Next, a breakdown voltage $BV_{sp}$ of a junction having a spherical type depletion region is described. When a high voltage is applied to a power MOSFET having a polygonal structure unit cell, an extended depletion region has a spherical shape. Because an electric field is concentrated on a region having the smallest radius of curvature, the breakdown voltage $BV_{sp}$ varies according to not only the characteristics of a raw material but also a junction depth. The breakdown voltage $BV_{sp}$ of a spherical type structure is practically determined by Equation 3 below.

$$BVsp = BVpp \times \left\{ \frac{rj^2}{Wc} + 2.14 \times \frac{rj^{\frac{6}{7}}}{Wc} - \left( \frac{rj^3}{Wc} + 3 \times \frac{rj^{\frac{13}{7}}}{Wc} \right)^{\frac{2}{3}} \right\} \quad \text{[Equation 3]}$$

where, $r_j$ is a junction depth and $W_c$ is a critical depletion depth.

Accordingly, it may be seen that a breakdown voltage $BVs_p$ in a spherical type structure is much lower than the ideal breakdown voltage $BV_{pp}$.

Next, a breakdown voltage of a junction having a cylindrical type depletion region is described. In a case when a unit cell has a linear structure, a body region on which the unit cell is formed also has a linear structure. At this point, if a distance between the adjacent body regions is remote, the depletion region expands in a cylindrical shape. The breakdown voltage $BV_{cyl}$ of a cylindrical type structure is determined by Equation 4 below.

$$BVcyl = \quad \text{[Equation 4]}$$
$$BVpp \times \left\{ \frac{1}{2} \times \left( \frac{rj^2}{Wc} + 2 \times \frac{rj^{\frac{6}{7}}}{Wc} \right) \times \text{Ln}\left( 1 + 2 \times \frac{Wc^{\frac{8}{7}}}{rj} \right) - \frac{rj^{\frac{6}{7}}}{Wc} \right\}$$

Referring to Equations 1 through 4, it may be seen that the breakdown voltage $BV_{cyl}$ of the cylindrical type structure is higher than the breakdown voltage $BVs_p$ of the spherical type structure, but is lower than the ideal breakdown voltage $BV_{pp}$. This denotes that when a junction in a device has a depletion region having a spherical shape structure and a cylindrical shape structure, the junction of the device may have a breakdown voltage much lower than the ideal breakdown voltage $BV_{pp}$ with respect to a planar structure depletion region. In order to compensate for the reduced breakdown voltage due to the structural cause, the increases in the specific resistance and thickness of the drift layer are required. However, if the specific resistance and thickness of the drift layer are increased, an on-resistance is increased.

FIG. 1 is a cross-sectional view of a power semiconductor device, for example, a MOSFET, according to an embodiment of the inventive concept.

Referring to FIG. 1, a drift region 104 of a first conductive type may be formed on a drain region 102 of a first conductive type, wherein the drain region 102 may be a semiconductor substrate. The concentration of impurities in the drift region 104 may be reduced from top to down. The drift region 104 may have a concentration of the first conductive type lower than that of the drain region 102.

A first body region 106 of a second conductive type may be formed on an upper predetermined region of the drift region 104. That is, the first body region 106 may be formed below an upper surface of the drift region 104. The first body region 106 may be formed on a position where it overlaps with a portion of a gate electrode 118 and a source electrode 120.

A second body region 107 of a second conductive type may be formed below the upper surface of the drift region 104 and in the first body region 106. The first body region 106 has a doping concentration lower than that of the second body region 107. The second body region 107 has a depth shallower than that of the first body region 106. That is, the first body region 106 has a lowest end deeper than that of the second body region 107. In the current inventive concept, "is formed deeper" denotes that a distance from the upper surface of the drift region 104, on which the gate electrodes 118 are formed, towards the drain region 102 is farther in a vertically downwards direction.

A third body region 109 of a second conductive type may be formed on a lower end of the first body region 106 by protruding downwards. As exemplary, the third body region 109 may protrude downwards from a central portion of the first body region 106; however, the inventive concept is not limited to the central portion. The third body, region 109 has a concentration of the second conductive type lower than that of the second body region 107. The third body region 109 and the first body region 106 may have the same concentration of the second conductive type. Alternatively, the third body region 109 may have a concentration of the second conductive type higher or lower than that of the first body region 106.

A depth of the third body region 109 may be deeper than that of the first body region 106. That is, the lowest end of the third body region 109 may be formed on a position deeper than that of the first body region 106. The third body region 109 may be positioned between the adjacent gate electrodes 118. A maximum value of an electric field in a power semiconductor device may vary according to the width W of the third body region 109, which will be described below.

Source regions 108 of a first conductive type may be formed below the upper surface of the drift region 104 and in the first body region 106. The source regions 108 have a concentration of the first conductive type higher than that of the drift region 104. Depths of the source regions 108 are shallower than that of the second body region 107. That is, the lowest end of the second body region 107 is formed on a position deeper than those of the source regions 108. The source regions 108 may be formed on a position that overlaps a portion of the gate electrode 118 and a portion of the source electrode 120.

A gate insulating layer 116 may be formed on channel regions 114 of the first body regions 106 and on the drift region 104 between the first body regions 106. The gate electrode 118 is formed on the gate insulating layer 116.

The source electrode 120 electrically connected to the source region 108 and a drain electrode 122 electrically connected to the drain region 102 are respectively formed. The source electrode 120 and the drain electrode 122 respectively are disposed on the surfaces, facing each other, of the drift region 104.

A highly doped drift region 112 of a first conductive type may be formed below the upper surface of the drift region 104 between the first body regions 106, that is, may be formed in the drift region 104 below the gate electrodes 118. The highly doped drift region 112 is doped with the same first conductive type as the drift region 104, and may be doped higher than the drift region 104. The highly doped drift region 112 may have a depth shallower than that of the first body region 106. Also, the highly doped drift region 112 may have a depth deeper than that of the source region 108. The highly doped drift region 112 is formed to reduce a JFET resistance-component of resistance components that constitute an on-resistance.

A width a of the drift region 104 that overlaps the gate electrode 118 between the first body regions 106 may be a width by which a depletion region formed by extending from the first body region 106 may form a planar junction structure.

In order to prevent the phenomenon of reducing a breakdown voltage by concentrating electric fields on an edge of the first body region 106, the smaller the width a between the first body regions 106 is better. However, if the width a of the drift region 104 that overlaps the gate electrode 118 between the first body regions 106 is small, a JFET region may be reduced, and, as a result, a rapid increase in a JFET resistance may occur. The highly doped drift region 112 may mitigate the problem of rapid increase of JFET resistance to some degree but, there is a limit due to the shallow depth of the highly doped drift region 112.

In the current inventive concept, due to the third body region 109 protruding from the lower end of the first body region 106, the increase in a JFET resistance and simultaneously a phenomenon of concentrating an electric field on the edge of the first body region 106 may be prevented without reducing the width a of the drift region 104.

Figure 2:
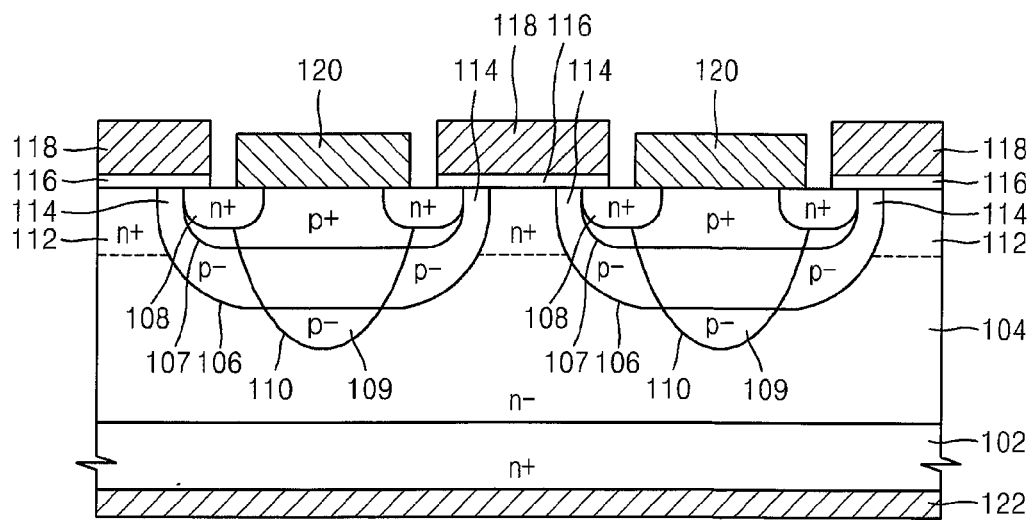
FIG. 2 is a cross-sectional view showing a doping profile of the power semiconductor device of FIG. 1, according to an embodiment of the inventive concept.

FIG. 2 is a cross-sectional view showing a doping profile of the power semiconductor device of FIG. 1, according to an embodiment of the inventive concept.

In FIGS. 1 and 2, like reference numerals indicate substantially like elements, and thus, the descriptions of elements described in FIG. 1 are not repeated.

A third doping profile 110 having a third doping concentration of a second conductive type is formed in the drift region 104. A first doping profile that has a boundary coinciding with a boundary of the first body region 106 and has a first doping concentration of a second conductive type are formed in the drift region 104. A second doping profile that has a boundary coinciding with a boundary of the second body region 107 and has a second doping concentration of a second conductive type are formed in the drift region 104. Accordingly, the third body region 109 may correspond to a region below the first body region 106 of the third doping profile 110.

The third doping concentration is lower than the first doping concentration of a second conductive type, and the second doping concentration is higher than the first doping concentration of a second conductive type.

Figure 3:
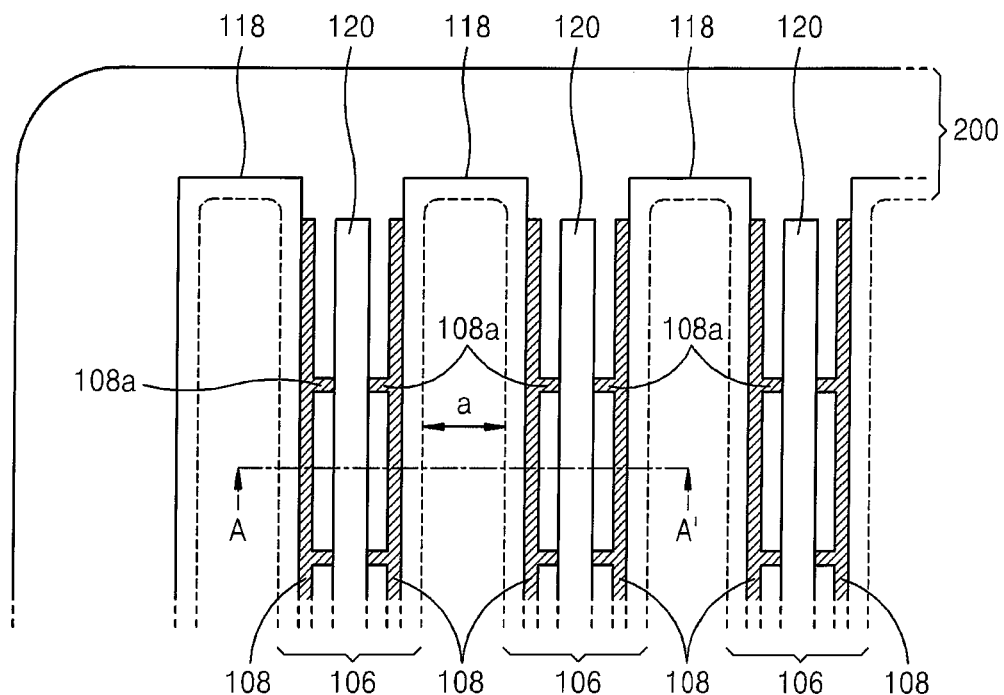
FIG. 3 is a layout of a portion of a power semiconductor device according to another embodiment of the inventive concept.
Figure 4:
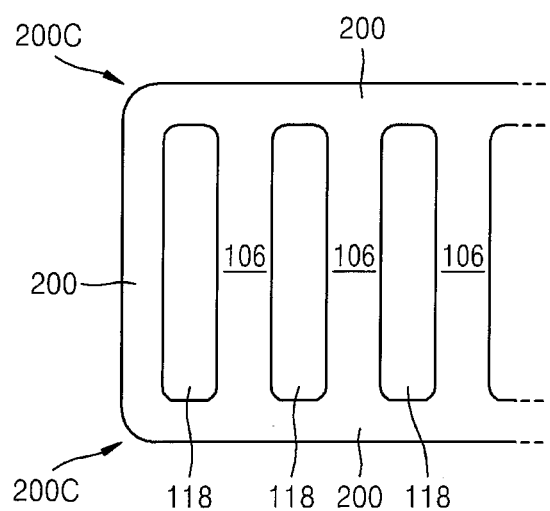
FIG. 4 is a layout showing a frame region and a body region of a power semiconductor device according to another embodiment of the inventive concept.

FIG. 3 is a layout of a portion of a power semiconductor device according to another embodiment of the inventive concept. FIG. 4 is a layout showing a frame region and a body region of a power semiconductor device according to another embodiment of the inventive concept. A cross-sectional view taken along line A-A' of FIG. 3 may correspond to the cross-sectional view of FIG. 1. In FIGS. 1, 3 and 4, like reference numerals indicate like elements, and thus, descriptions thereof will not be repeated.

An entire cell is surrounded by an outermost frame region 200, and an upper part and a lower part of the outermost frame region 200 are mutually connected in a vertical direction by the first body region 106. That is, the upper part of the first body region 106 is connected to the upper part of the outermost frame region 200, and the lower part of the first body region 106 is connected to the lower part of the outermost frame region 200. The width a between the adjacent first body regions 106 may be formed small enough to have a small value. Edges 200c of the outermost frame region 200 may be formed to have a radius of curvature greater than a predetermined size, for example, greater than 100 μm to prevent the formation of a spherical junction structure. Also, edges of the first body region 106 may have a radius of curvature greater than 100 μm.

The first body region 106, the gate insulating layer 116, and the gate electrode 118 may be disposed in a stripe type. Left and right sides of the gate electrode 118 are surrounded by the first body regions 106, and upper and lower sides of the gate electrode 118 and a side surface of the outermost gate electrode 118 contact the frame region 200. The source electrode 120 is disposed in a stripe type between the adjacent gate electrodes 118 by separating a predetermined distance from the gate electrodes 118. The source region 108 is formed long along a side surface of the gate electrode 118, and additional source regions 108a for connecting the adjacent source regions 108 to each other are formed to be connected to the source electrode 120 across the first body region 106.

Figure 5:
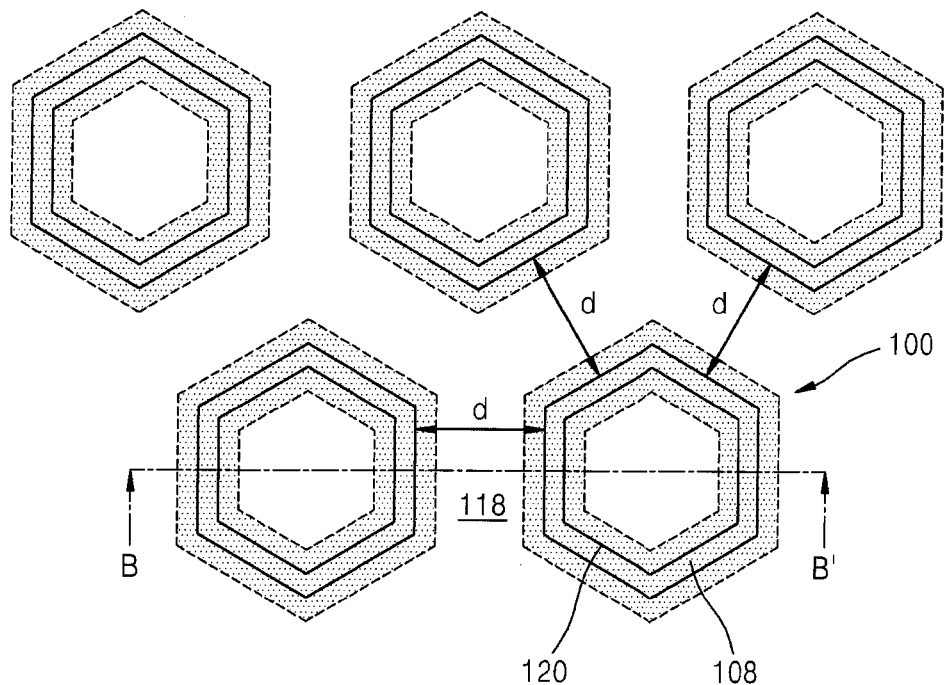
FIG. 5 is a layout of a power semiconductor device according to another embodiment of the inventive concept.

FIG. 5 is a layout of a power semiconductor device according to another embodiment of the inventive concept. A cross-sectional view taken along a line B-B' of FIG. 5 may correspond to the cross-sectional view of FIG. 1. In FIGS. 1 and 5, like reference numerals indicate like elements, and thus, the descriptions thereof will not be repeated.

Referring to FIG. 5, a power semiconductor device having a polygonal structure unit cell is depicted. In order for the power semiconductor device, for example, a MOSFET to have a high breakdown voltage and a low on-resistance characteristic, hexagonal shape unit cells are disposed in equal distances d. Because the power semiconductor device is formed in a polygonal structure, a channel density per unit area may be increased. Accordingly, the effect of reducing on-resistance may be achieved.

Figure 6:
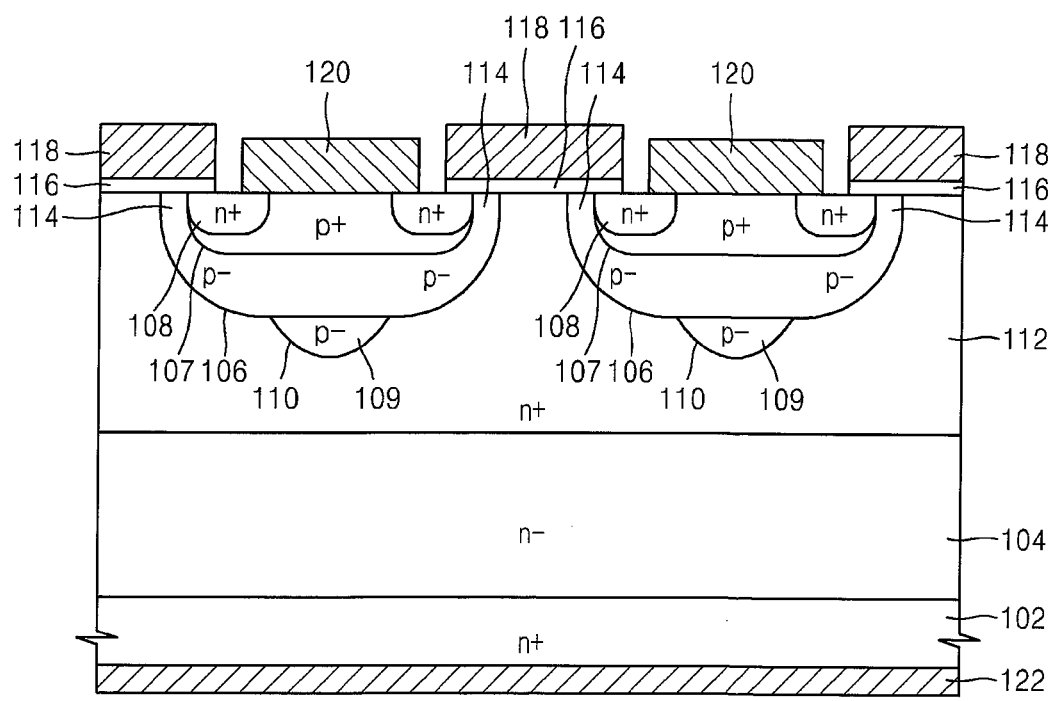
FIG. 6 is a cross-sectional view of a power semiconductor device, for example, a MOSFET, according to another embodiment of the inventive concept.

FIG. 6 is a cross-sectional view of a power semiconductor device, for example, a MOSFET, according to another embodiment of the inventive concept. In FIGS. 1, 2 and 6, like reference numerals indicate like elements, and thus, the descriptions thereof will not be repeated.

Referring to FIG. 6, unlike in FIG. 1, the highly doped drift region 112 may be formed not only between the first body regions 106 but also deeper than the source region 108, the first body region 106, the second body region 107, and the third body region 109. The highly doped drift region 112 may have the same conductive type as the drift region 104, and may be doped to a concentration higher than that of the drift region 104. The highly doped drift region 112 is a region for reducing a JFET resistance component of resistance components that constitute an on-resistance.

In FIG. 1, the highly doped drift region 112 is introduced to mitigate a rapid increase of the JFET resistance due to the reduction of the JFET region. However, a sufficient effect may not be expected due to shallow depth of the highly doped drift region 112. However, as shown in FIG. 6, when the highly doped drift region 112 is formed deeper than the source region 108, the first body region 106, the second body region 107, and the third body region 109, the problem of rapidly increasing of the JFET resistance may be effectively prevented.

Figure 7:
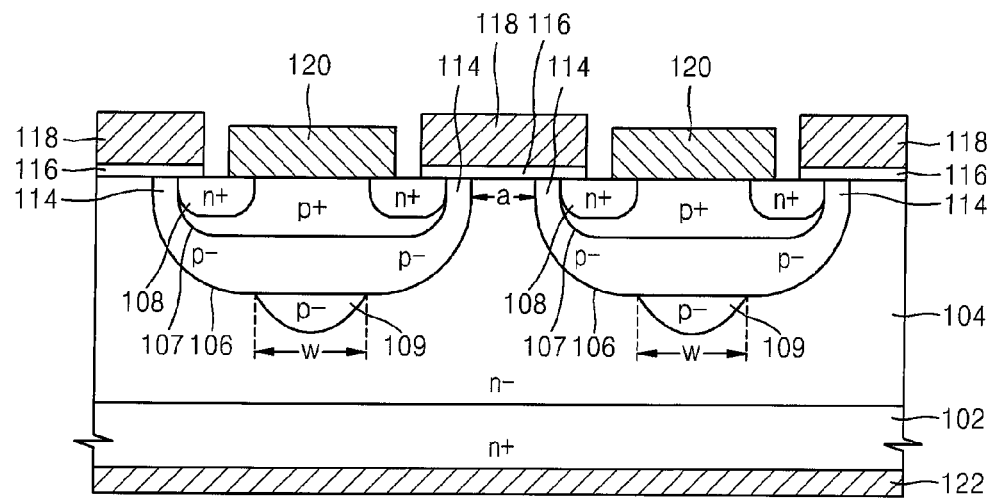
FIG. 7 is a cross-sectional view of a power semiconductor device, for example, a MOSFET, according to another embodiment of the inventive concept.

FIG. 7 is a cross-sectional view of a power semiconductor device, for example, a MOSFET, according to another embodiment of the inventive concept. In FIGS. 1, 2, and 7, like reference numerals indicate like elements, and thus, the descriptions thereof will not be repeated.

Referring to FIG. 7, the highly doped drift region 112 depicted in FIG. 1 is not included in the semiconductor device in FIG. 7. Accordingly, the small width a of the drift region 104 that overlaps the gate electrode 118 between the first body regions 106 may be a burden to the operation of the semiconductor because the JFET resistance may be rapidly increased.

However, the increase in the JFET resistance and the concentration of an electric field on the edge of the first body region 106 may be simultaneously prevented due to the third body region 109 formed by protruding on the lower end of the first body region 106.

Figure 8:
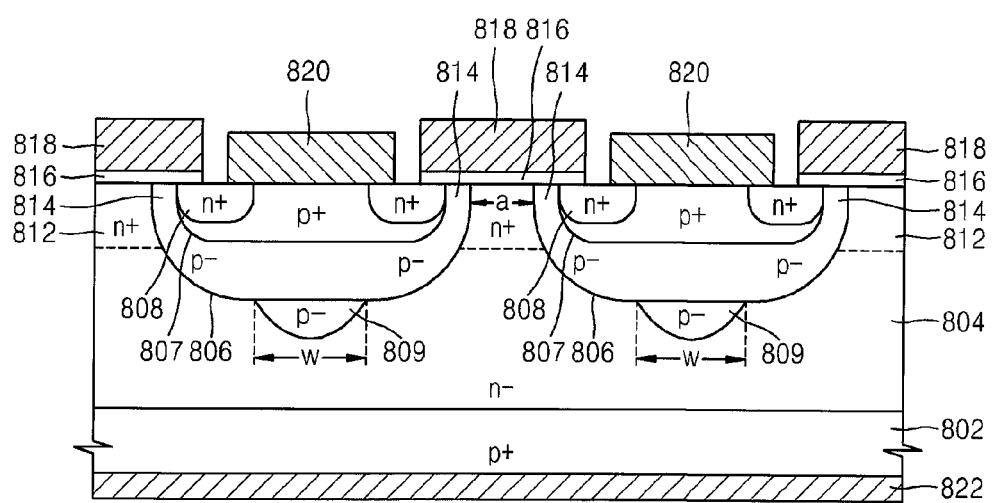
FIG. 8 is a cross-sectional view of a power semiconductor device, for example, an insulation gate bi-polar transistor (IGBT), according to another embodiment of the inventive concept.
Figure 9A:
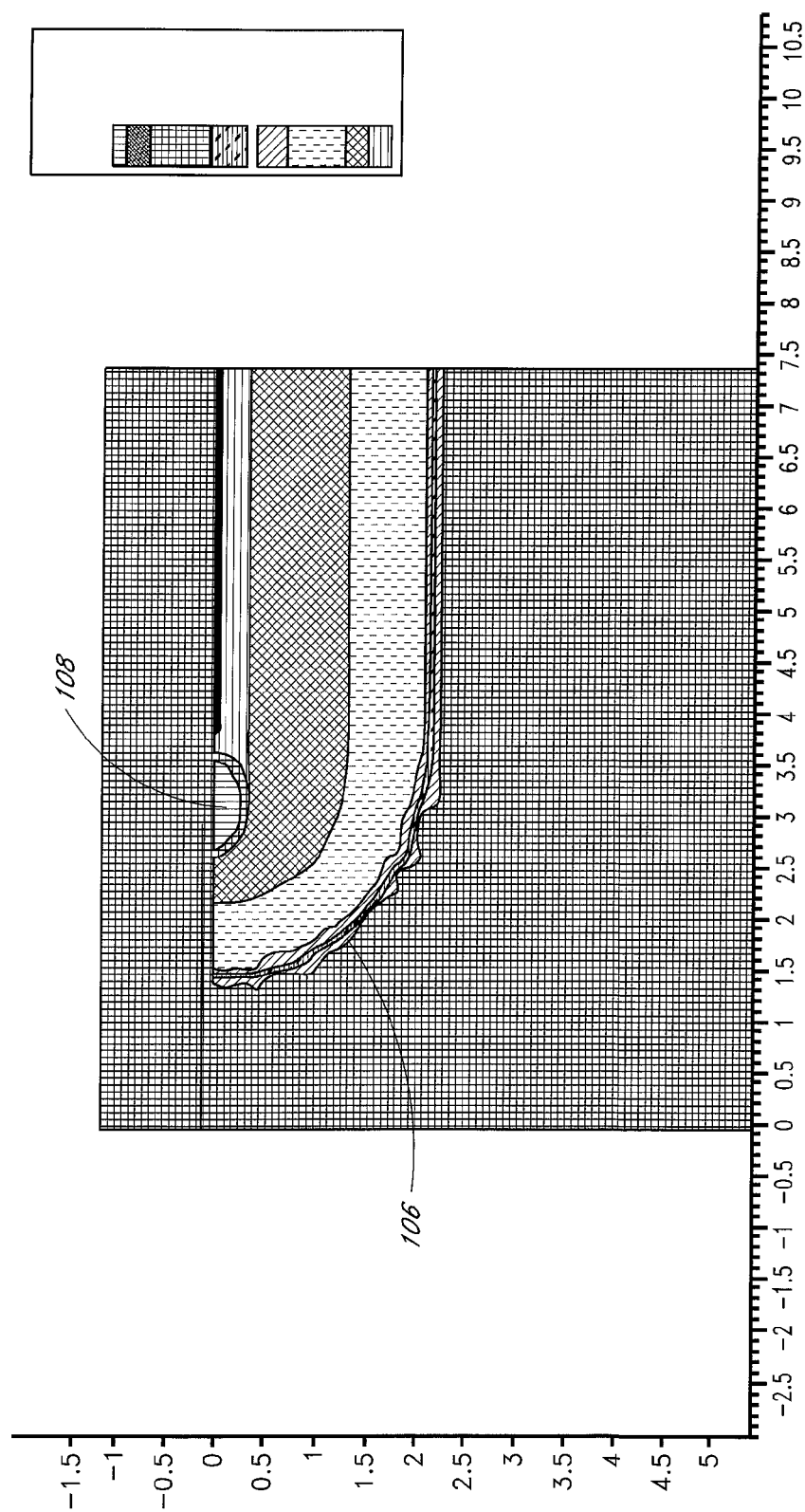
FIG. 9, which consists of FIGS. 9A, 9B, 9C, and 9D, shows simulation results of doping concentrations with respect to a power semiconductor device according to an embodiment of the inventive concept.
Figure 9B:
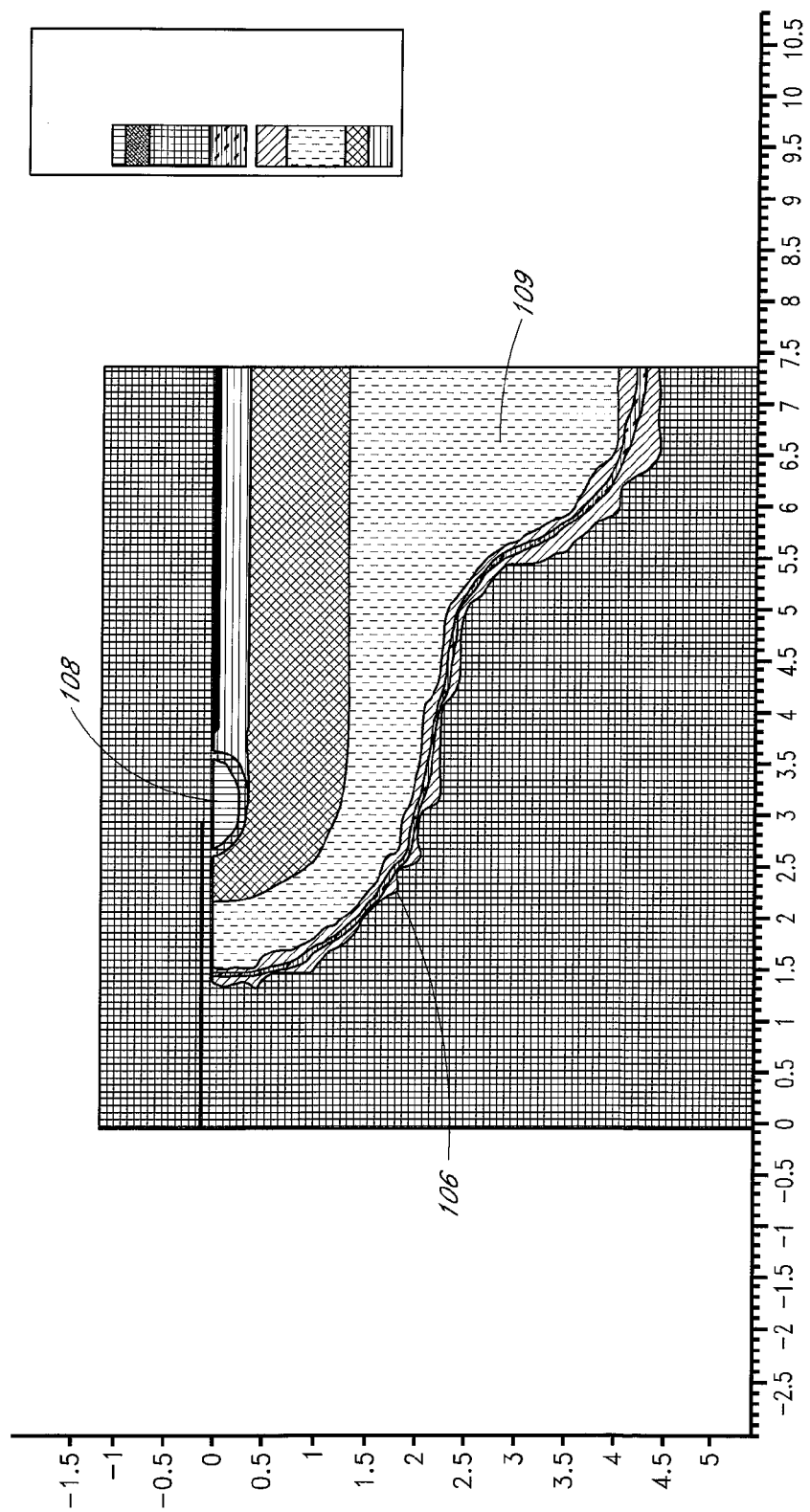
Figure 9C:
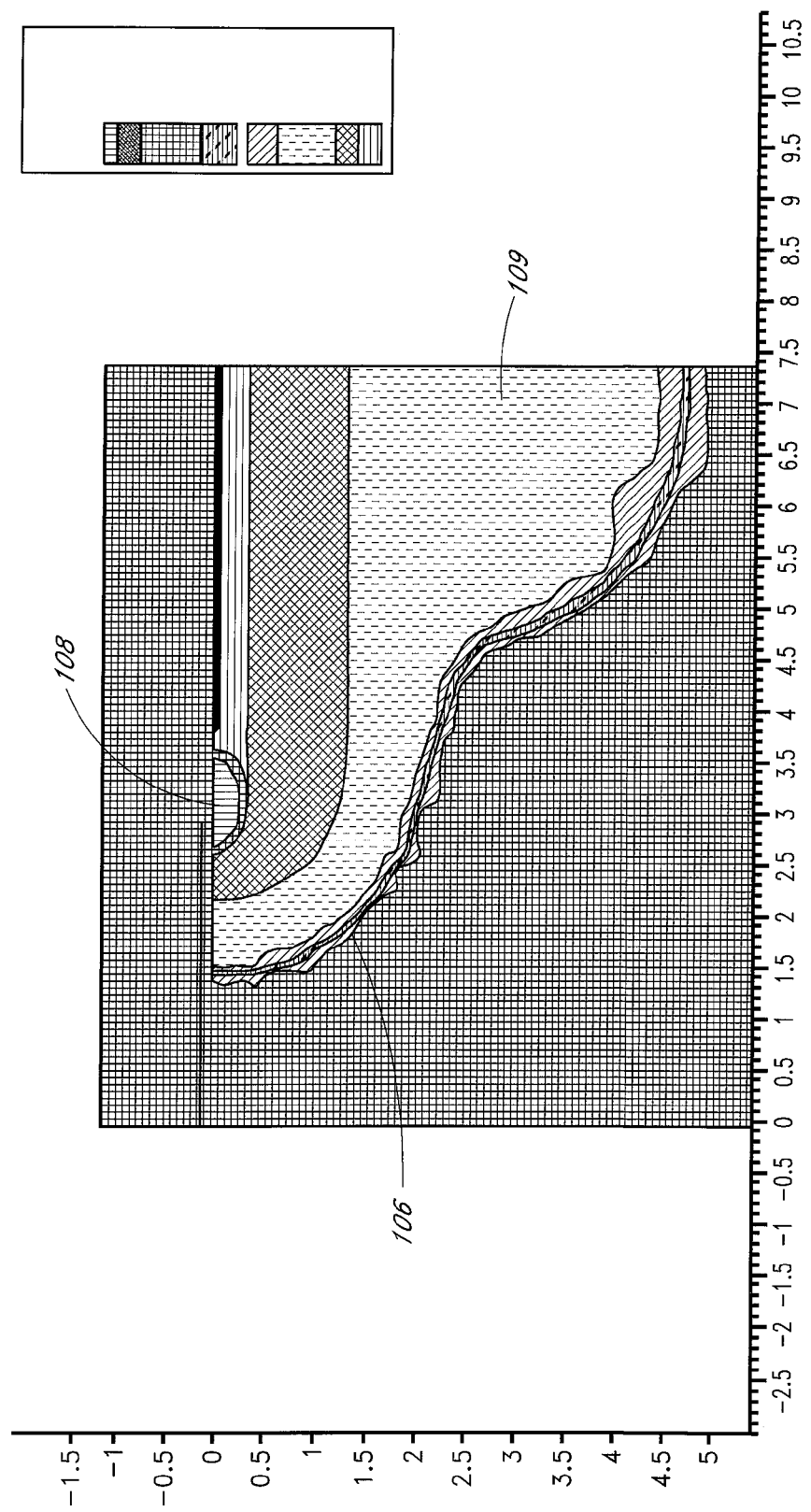
Figure 9D:
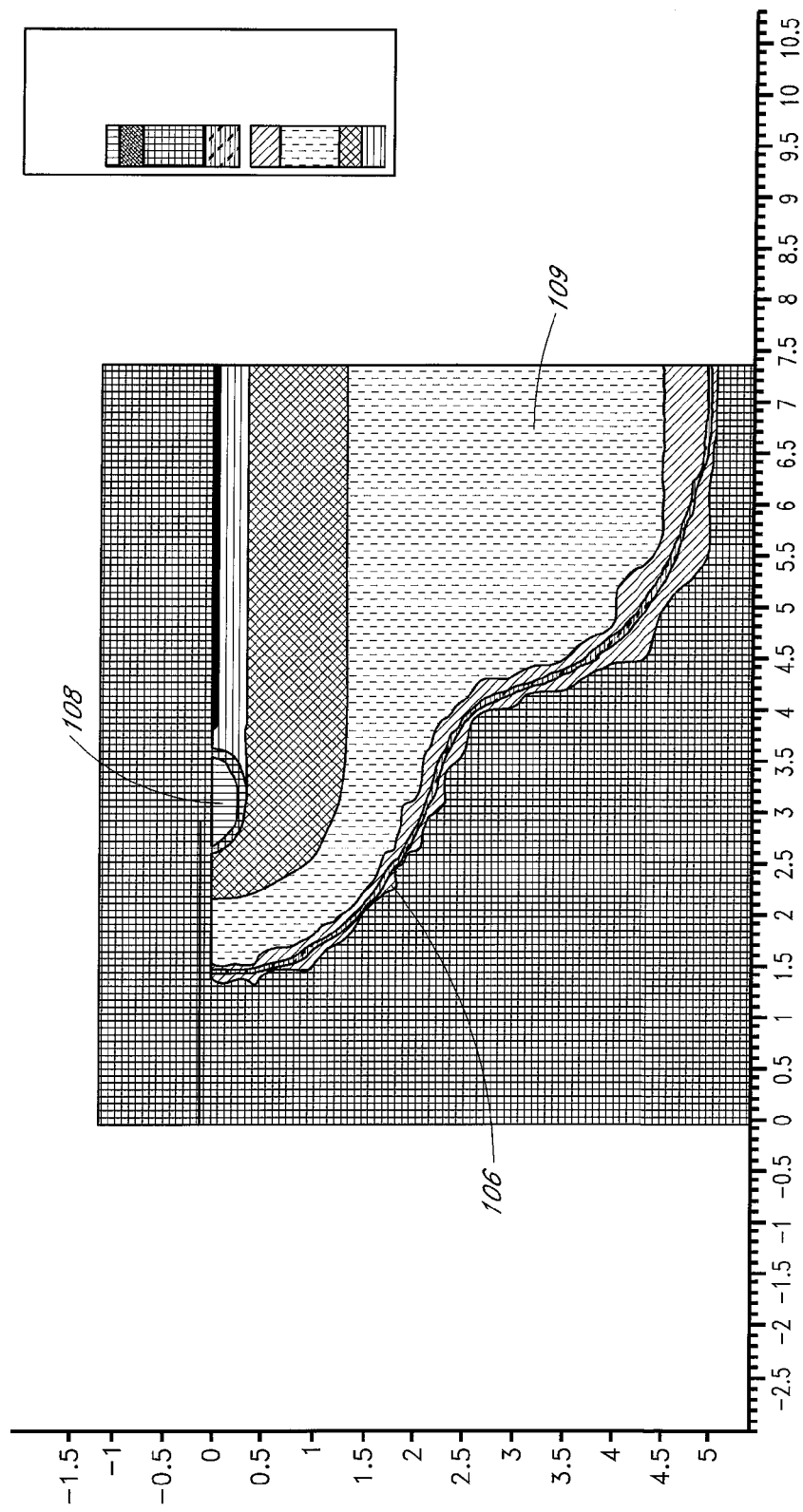
Figure 10A:
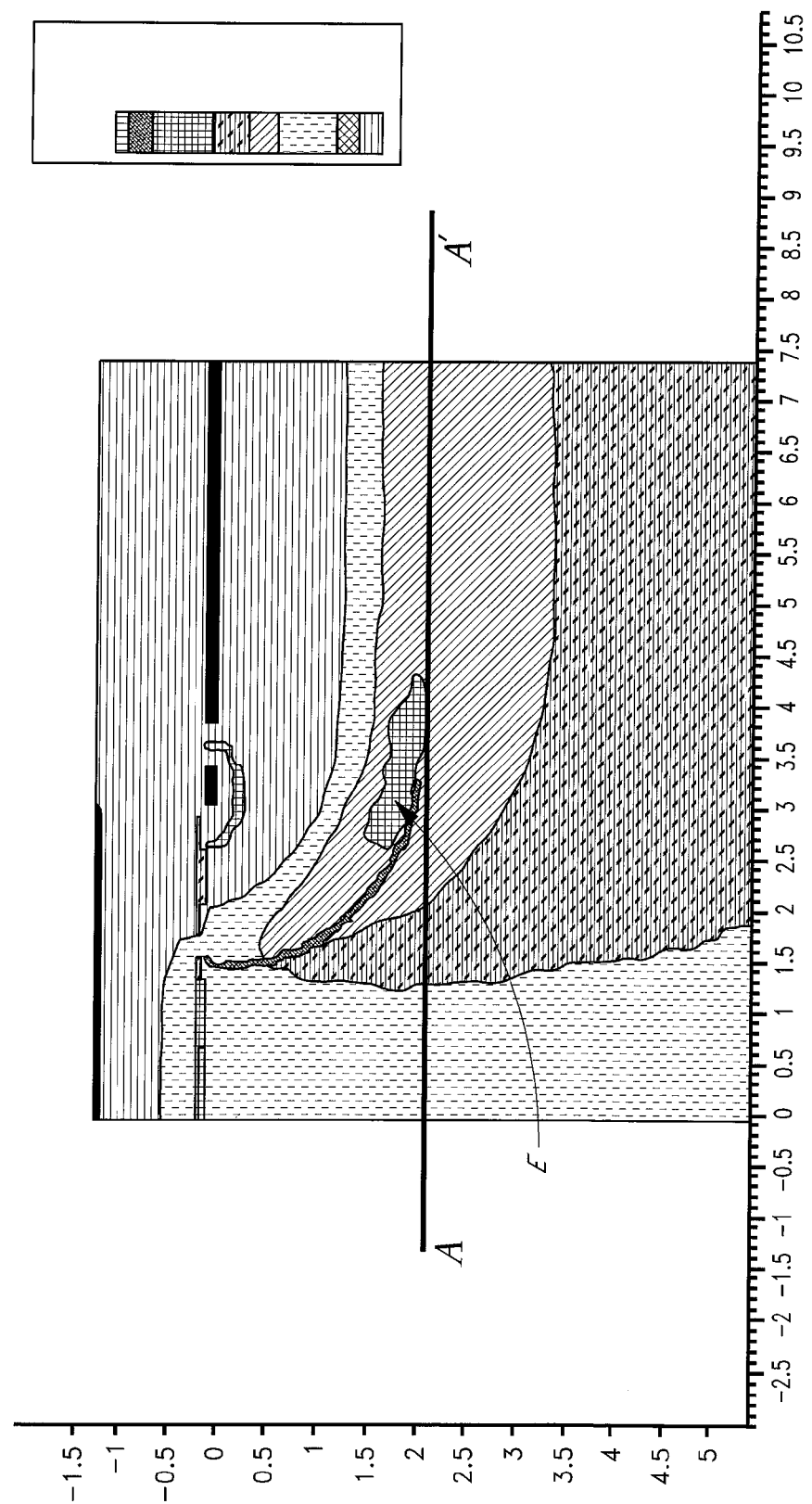
FIG. 10, which consists of FIGS. 10A, 10B, 10C, and 10D, shows simulation results of field effects generated in a power semiconductor device according to an embodiment of the inventive concept.
Figure 10B:
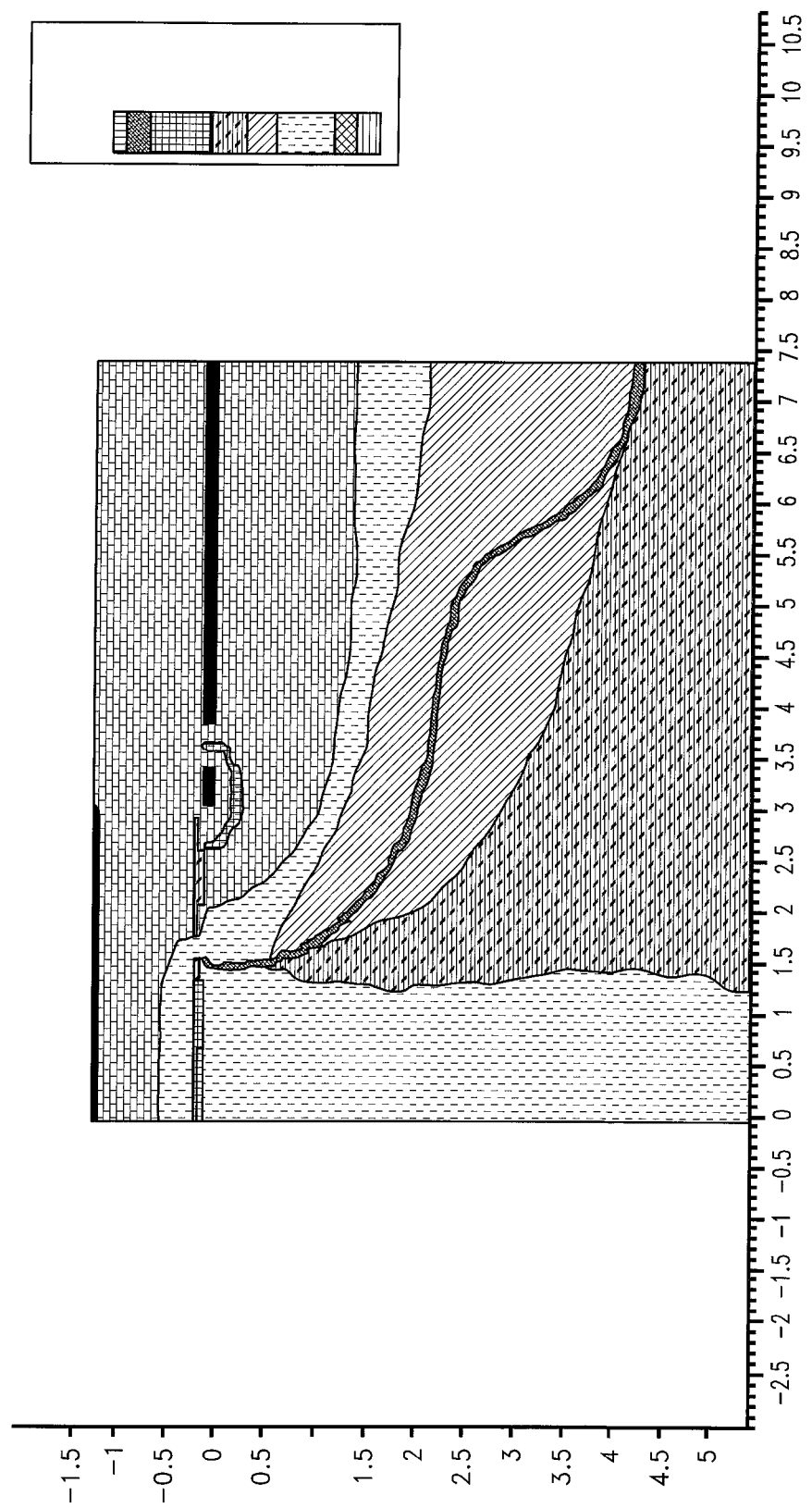
Figure 10C:
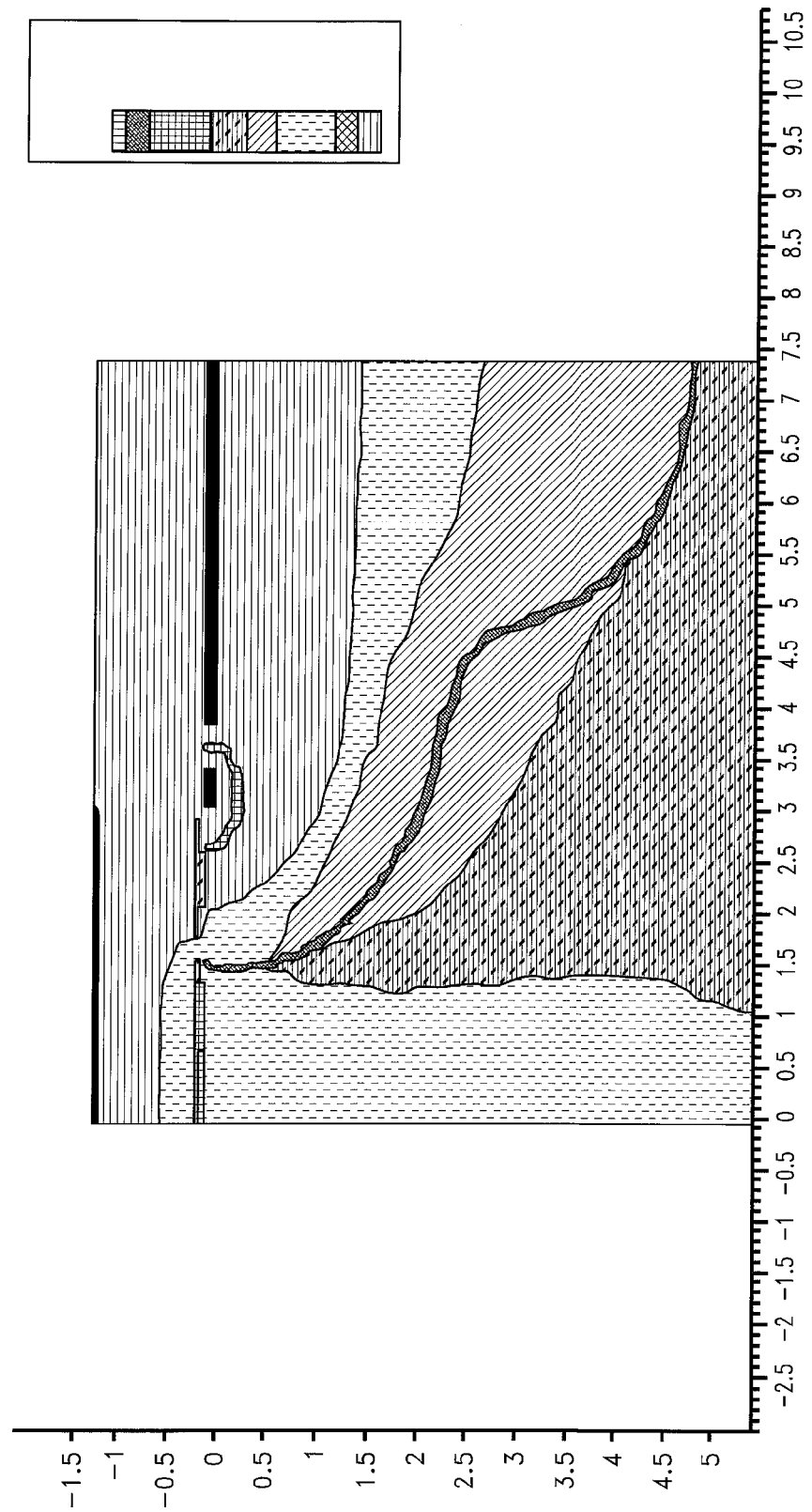
Figure 10D:
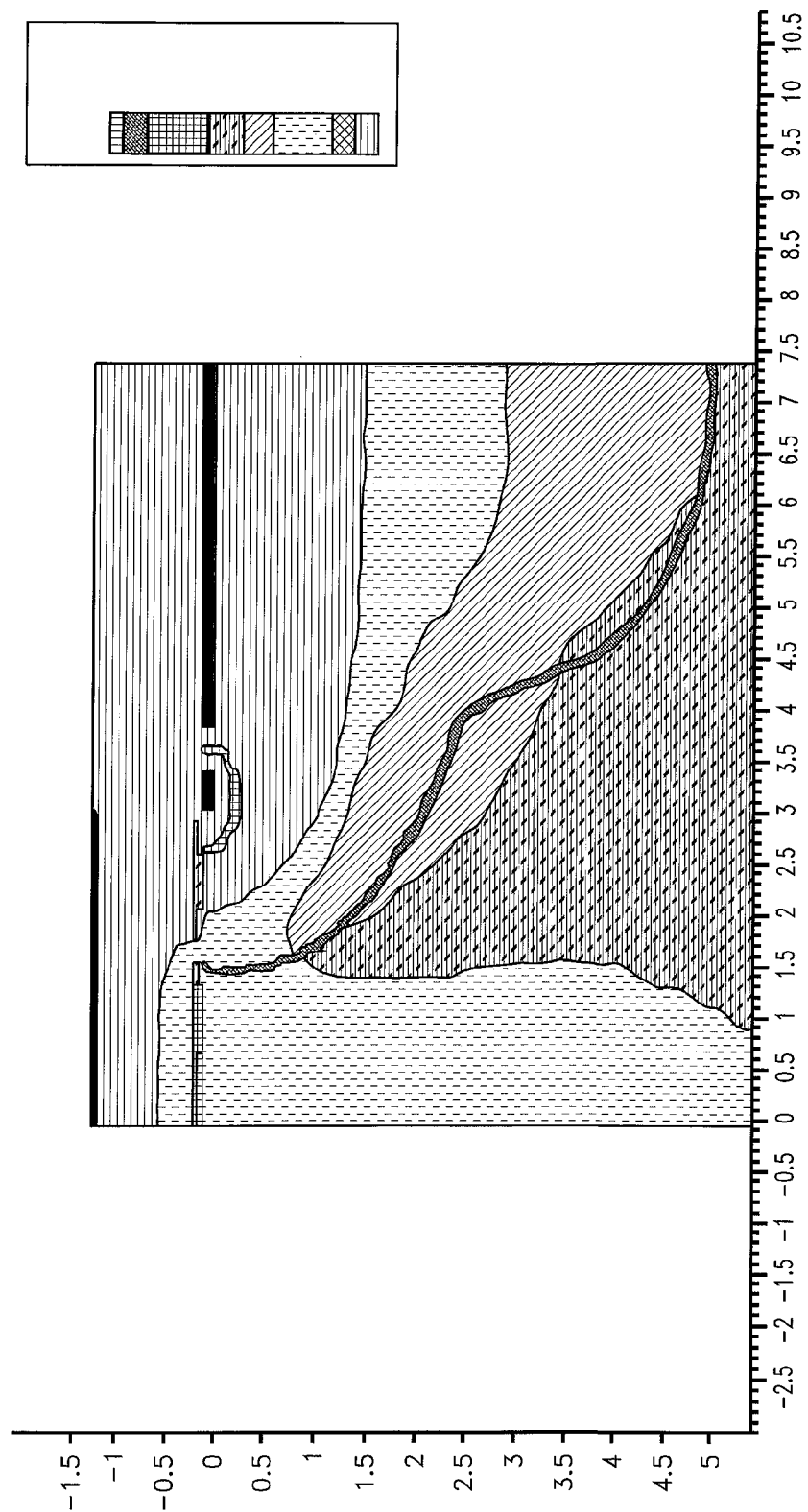

FIG. 8 is a cross-sectional view of a power semiconductor device, for example, an insulation gate bi-polar transistor (IGBT), according to another embodiment of the inventive concept.

Referring to FIG. 8, a drift region 804 of a first conductive type may be formed on a collector region 802 of a second conductive type, wherein the collector region 802 may be a semiconductor substrate. A concentration of impurities in the drift region 804 may be reduced from top to down. The drift region 804 may have a concentration of the first conductive type lower than that of the collector region 802.

A first base region 806 of a second conductive type may be formed on an upper predetermined region of the drift region 804. That is, the first base region 806 is formed below a upper surface of the drift region 804. The first base region 806 may be formed in a region where the drift region 804 overlaps with a portion of gate electrodes 818 and an emitter electrode 820.

A second base region 807 of a second conductive type may be formed below the upper surface of the drift region 804 and in the first base region 806. The first base region 806 may have a doping concentration lower than that of the second base region 807. The second base region 807 has a depth shallower than that of the first base region 806. That is, the lowest end of the first base region 806 is deeper than that of the second base region 807. In the current inventive concept, "is formed deeper" denotes that a distance from the upper surface of the drift region 804, on which the gate electrodes 818 are formed, towards the collector region 802 is farther in a vertically downwards direction.

A third base region 809 of a second conductive type may be formed by protruding downwards from a lower end of the first base region 806. The third base region 809 may have a concentration of the second conductive type lower than that of the first base region 806. Also, the third base region 809 may have a concentration of the second conductive type lower than that of the second base region 807. The third base region 809 has a depth deeper than that of the first base region 806. That is, the lowest end of the third base region 809 is deeper than that of the first base region 806. The third base region 809 may be positioned between the gate electrodes 818 adjacent to each other. A maximum value of an electric field in the power semiconductor device may vary according to a width w of the third base region 809.

An emitter region 808 of a first conductive type may be formed below an upper surface of the drift region 804 and in the first base region 806. The emitter region 808 has a concentration of the first conductive type higher than that of the drift region 804. The emitter region 808 has a depth shallower than that of the second base region 807. That is, the lowest end of the second base region 807 is deeper than that of the emitter region 808. The emitter region 808 may be formed on a position where it overlaps with a portion of the gate electrode 818 and a portion of an emitter electrode 820.

A gate insulating layer 816 may be formed on channel regions 814 of the first base region 806 and on the drift region 804 between the first base regions 806. A gate electrode 818 may be formed on the gate insulating layer 816.

The emitter electrode 820 electrically connected to the emitter region 808 and a collector electrode 822 electrically connected to the collector region 802 are respectively formed. The emitter electrode 820 and the collector electrode 822 are respectively formed on surfaces, facing each other, of the drift region 804.

In order to prevent the reduction of a breakdown voltage of the power semiconductor device due to the concentration of an electric field on edges of the first base region 806, the smaller width a between the first base regions 806 is the better. However, when the width a of the drift region 804 that overlaps the gate electrode 818 between the first base regions 806 is small, a problem of rapidly increasing an on-resistance may occur.

In the current inventive concept, due to the third base region 809 that has a doping concentration lower than that of the first base region 806 of a second conductive type and is formed by protruding from the lower end of the first base region 806, the increase in a resistance and a phenomenon of concentrating an electric field on the edge of the first base region 806 may be simultaneously prevented without reducing the width a of the drift region 804.

FIG. 9 shows simulation results of doping concentrations with respect to a power semiconductor device according to an embodiment of the inventive concept.

Referring to FIG. 9, test results are shown in images (a) through (d). First, FIG. 9 (a) is the simulation result of doping concentration of a power semiconductor device A that does not have the third body region 109 (refer to FIG. 1). FIG. 9 (b) is the simulation result of doping concentration of a power semiconductor device B that has the third body region 109 (refer to FIG. 1) having a width w (refer to FIG. 1) of 2 μm. FIG. 9 (c) is the simulation result of doping concentration of a power semiconductor device C that has the third body region 109 (refer to FIG. 1) having a width w (refer to FIG. 1) of 3 μm. FIG. 9 (d) is the simulation result of doping concentration of a power semiconductor device D that has the third body region 109 (refer to FIG. 1) having a width w (refer to FIG. 1) of 4 μm.

Referring to FIG. 9 (b) through (d), it is seen that the doping concentration of the second conductive type is gradually reduced from the second body region 107 (refer to FIG. 1) towards the third body region 109 (refer to FIG. 1) through the first body region 106 (refer to FIG. 1).

FIG. 10 shows simulation results of field effects generated in a power semiconductor device according to an embodiment of the inventive concept. FIG. 10 (a) through (d) respectively correspond to the cases of FIG. 9 (a) through (d). A line A-A' in FIG. 10 is a position corresponding to the depth of 2 μm from the upper surface of the drift region 104 (refer to FIG. 1).

Referring to FIG. 10, in the power semiconductor device A that does not have the third body region 109 (refer to FIG. 1), it is confirmed that an electric field E is concentrated on an edge region of the first body region 106 (refer to FIG. 1). The concentration of an electric field E may cause a phenomenon of reducing a breakdown voltage.

However, in the power semiconductor devices that have the third body region 109, it is confirmed that the phenomenon of concentrating an electric field E on an edge of the first body region 106 (refer to FIG. 1) is mitigated. Accordingly, the presence of the third body region 109 (refer to FIG. 1) may prevent the reduction of a breakdown voltage in the power semiconductor device.

Figure 11:
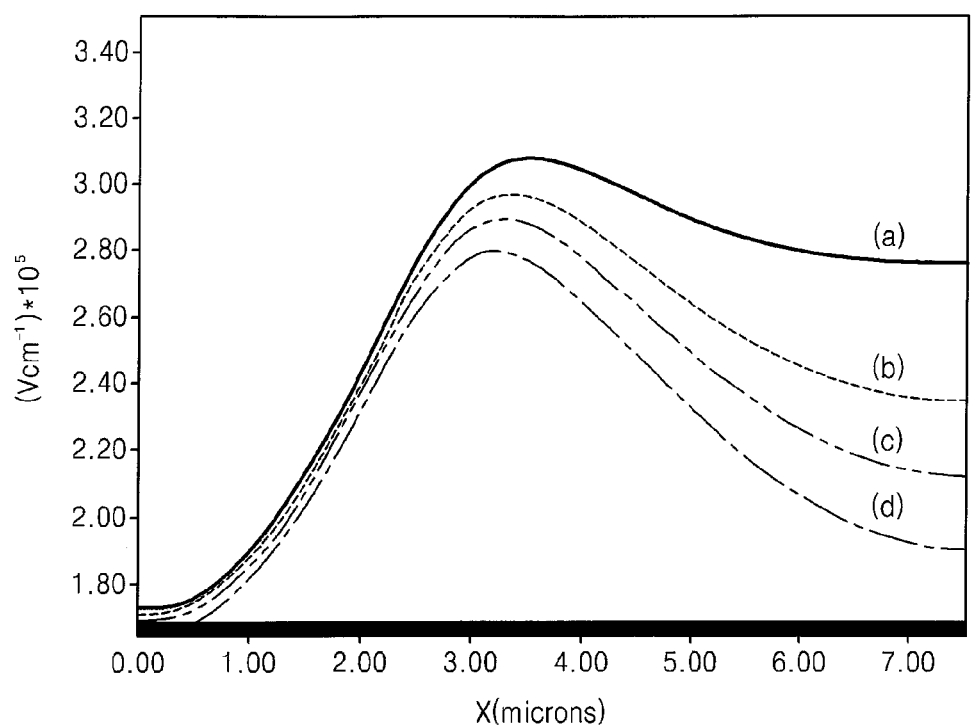
FIG. 11 is a graph showing the magnitude of an electric field along the line A-A' of FIG. 10.

FIG. 11 is a graph showing the magnitude of an electric field along the line A-A' of FIG. 10. Lines (a) through (d) in FIG. 11 respectively correspond to FIG. 9 (a) through (d) and FIG. 10 (a) through (d).

Referring to FIG. 11, it is confirmed that the electric field gradually increases along the line A-A' of FIG. 10, and after showing a maximum value at a P-N junction region (for example, at the edge of the first body region 106 of FIG. 1), it gradually decreases.

In the power semiconductor devices B, C, and D that respectively have the third body regions 109 (refer to FIG. 1), the magnitude of the electric field at the edge of the first body region 106 (refer to FIG. 1) is smaller than that in the power semiconductor device A that does not have the third body regions 109 (refer to FIG. 1). Also, in the power semiconductor device C that has the third body regions 109 having a width w (refer to FIG. 1) of 3 μm, the magnitude of the electric field at the edge of the first body region 106 (refer to FIG. 1) is smaller than that in the power semiconductor device B that has the third body regions 109 (refer to FIG. 1) having a width w of 2 μm. Also, in the power semiconductor device D that has the third body regions 109 having a width w (refer to FIG. 1) of 4 μm, the magnitude of the electric field at the edge of the first body region 106 (refer to FIG. 1) is smaller than that in the power semiconductor device C that has the third body regions 109 (refer to FIG. 1) having a width w of 3 μm.

That is, it is confirmed that, as the width w of the third body regions 109 (refer to FIG. 1) increases, the magnitude of the electric field at the edge of the first body region 106 (refer to FIG. 1) is greatly reduced.

Figure 12:
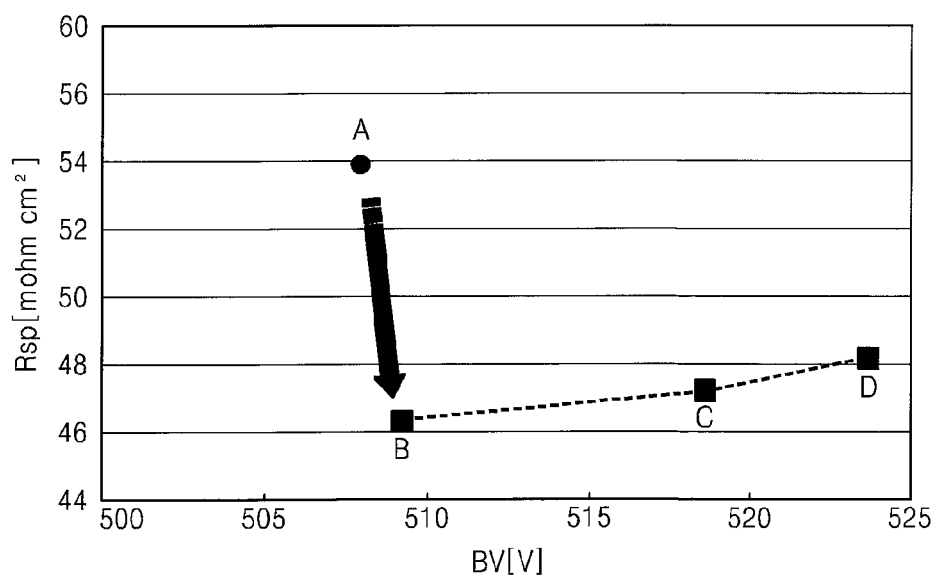
FIG. 12 is a graph showing a test result of a relationship between a breakdown voltage and a specific resistance $R_{sp}$ of a power semiconductor device according to an embodiment of the inventive concept.

FIG. 12 is a graph showing a test result of a relationship between a breakdown voltage and a specific resistance $R_{sp}$ in a power semiconductor device according to an embodiment of the inventive concept. Cases A through D respectively correspond to the FIG. 9 (a) through (d), FIG. 10 (a) through (d), and the lines (a) through (d) in FIG. 11. The value of specific resistance $R_{sp}$ represents an on-resistance per unit area of a power semiconductor device.

Referring to FIG. 12, it is seen that the power semiconductor device B that has the third body region 109 (refer to FIG. 1) having a width w of 2 μm has a specific resistance $R_{sp}$ lower than that of the power semiconductor device A that does not have the third body region 109 (refer to FIG. 1). Also, it is seen that, as the width w of the third body region 109 (refer to FIG. 1) increases, the increase in the specific resistance $R_{sp}$ is minimized, but the breakdown voltage is remarkably increased.

Accordingly, according to the technical spirit of the current inventive concept, a low on-resistance may be realized by using a further higher doping concentration (a low specific resistance $R_{sp}$) and a further smaller thickness of a drift region, and thus, a power semiconductor device having a high breakdown voltage may be realized.

FIGS. 13 through 16 are cross-sectional views for explaining a method of fabricating a power semiconductor device according to an embodiment of the inventive concept. In FIGS. 1 and 2 and 13 through 16, like reference numerals indicate like elements, and thus, the descriptions of elements that are described with reference to FIGS. 1 and 2 will not be repeated. Operations for forming the source electrode 120, the gate insulating layer 116, and the gate electrode 118 are well known in the art, and thus, descriptions thereof will be omitted.

Figure 13:
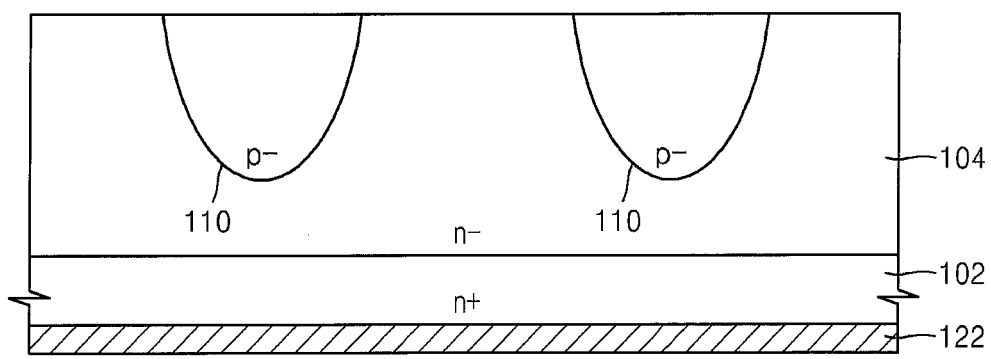
FIGS. 13 through 16 are cross-sectional views for explaining a method of fabricating a power semiconductor device according to an embodiment of the inventive concept.

Referring to FIG. 13, an operation for forming a drain region 102 of a first conductive type and an operation for forming a drift region 104 of a first conductive type on the drain region 102 are performed. Next, a third doping profile 110 having a third doping concentration of a second conductive type is formed in the drift region 104 by an ion implantation.

Figure 14:
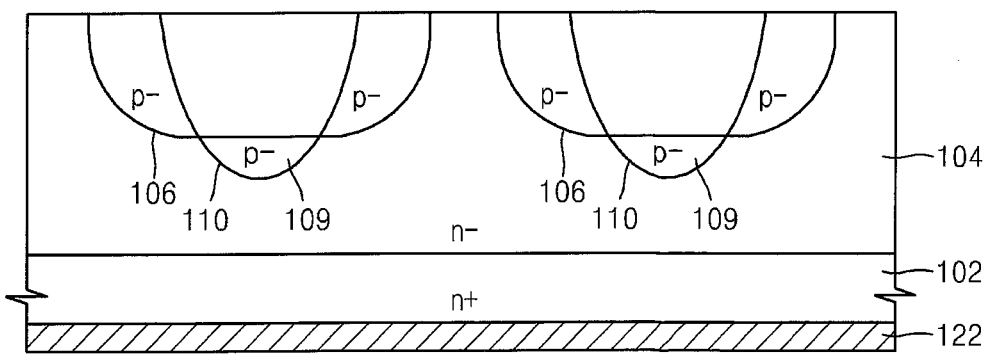

Referring to FIG. 14, a first doping profile having a first doping concentration and having a boundary coinciding with the boundary of the first body region 106 is formed in the drift region 104 by an ion implantation.

Figure 15:
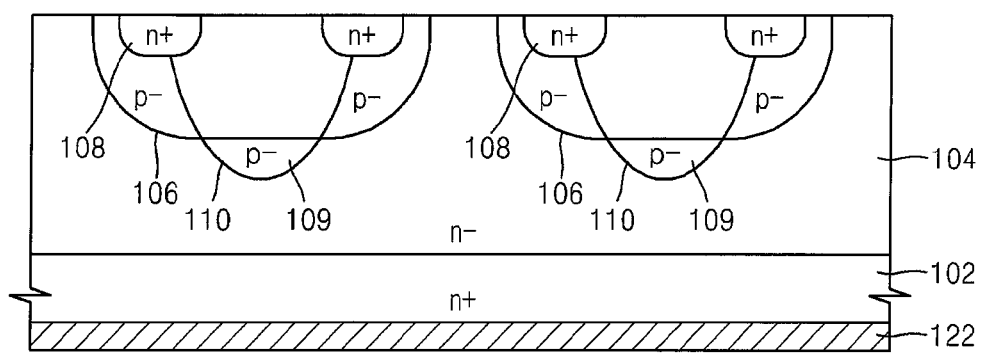

Referring to FIG. 15, a fourth doping profile having a first doping concentration and having a boundary coinciding with the boundary of the source region 108 is formed in the drift region 104 by an ion implantation.

Figure 16:
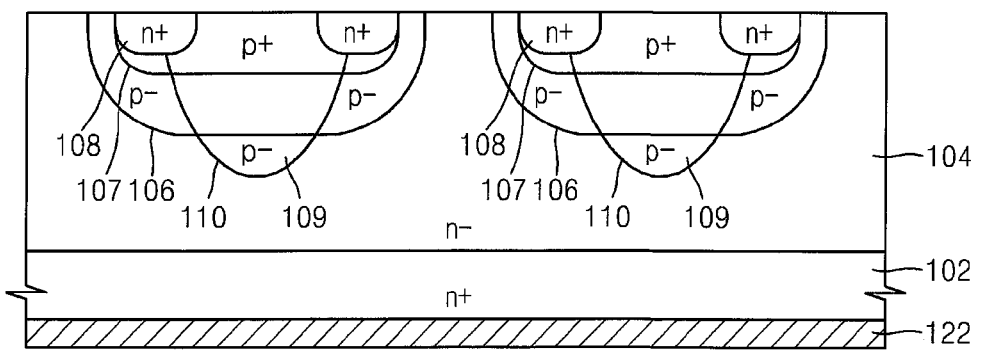

Referring to FIG. 16, a second doping profile having a second doping concentration and having a boundary coinciding with a boundary of the second body region 107 is formed in the drift region 104 by an ion implantation.

In the method of fabricating a power semiconductor device according to an embodiment of the inventive concept, the operations described in FIGS. 13 through 16 may be sequentially performed in the stated order. However, the method of fabricating a power semiconductor device according to the inventive concept is not limited to the order stated above. In modified embodiments, the operations for forming the first doping profile, the second doping profile, and the third doping profile may be performed in an arbitrary order.

While the inventive concept has been particularly shown and described with reference to exemplary embodiments thereof, it will be understood that various changes in form and details may be made therein without departing from the spirit and scope of the following claims.

What is claimed is:

1. A method of fabricating a power semiconductor device, the method comprising:
   forming a drain region of a first conductive type;
   forming a drift region of the first conductive type on the drain region;
   forming a first body region of a second conductive type below an upper surface of the drift region;
   forming a second body region of the second conductive type having a depth shallower than a depth of the first body region below the upper surface of the drift region and in the first body region;
   forming a third body region of the second conductive type protruded downwards from a lower end of the first body region to a position shallower than that of an upper surface of the drain region;
   forming a source region of the first conductive type having a depth shallower than the depth of the second body region below the upper surface of the drift region and in the first body region;
   forming a gate insulating layer on a channel region of the first body region and on the drift region;

forming a gate electrode on the gate insulating layer;
forming a source electrode electrically connected to the source region; and
forming a drain electrode electrically connected to the drain region.

2. The method of claim 1, wherein the first body region has a doping concentration of the second conductive type lower than that of the second body region, and the third body region has a doping concentration of the second conductive type lower than that of the second body region.

3. The method of claim 1, wherein the forming of the first body region is performed after performing the forming of the third body region and the forming of the second body region is performed after performing the forming of the first body region.

* * * * *